US009673143B2

United States Patent
Kamiyama (10) Patent No.: US 9,673,143 B2
(45) Date of Patent: Jun. 6, 2017

(54) SEMICONDUCTOR DEVICE AND MANUFACTURING METHOD OF THE SAME

(71) Applicant: SHINDENGEN ELECTRIC MANUFACTURING CO., LTD., Tokyo (JP)

(72) Inventor: Yoshihiro Kamiyama, Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 14/901,712

(22) PCT Filed: May 29, 2015

(86) PCT No.: PCT/JP2015/065519
§ 371 (c)(1),
(2) Date: Aug. 19, 2016

(87) PCT Pub. No.: WO2016/194033
PCT Pub. Date: Dec. 8, 2016

(65) Prior Publication Data
US 2016/0351488 A1    Dec. 1, 2016

(51) Int. Cl.
*H01L 21/48* (2006.01)
*H01L 23/498* (2006.01)
(Continued)

(52) U.S. Cl.
CPC .... *H01L 23/49861* (2013.01); *H01L 21/4825* (2013.01); *H01L 21/4839* (2013.01);
(Continued)

(58) Field of Classification Search
CPC ....... H01L 2924/00; H01L 2924/00014; H01L 2224/48091; H01L 2224/48247;
(Continued)

(56) References Cited

U.S. PATENT DOCUMENTS

2009/0057869 A1* 3/2009 Hebert .................... H01L 24/40
257/691
2010/0090668 A1* 4/2010 Girdhar ................ H01L 23/645
323/282
(Continued)

FOREIGN PATENT DOCUMENTS

JP          3/195053          8/1991
JP      2002/119069 A         4/2002
(Continued)

OTHER PUBLICATIONS

ISR for related PCT/JP2015/065519 mailed on Sep. 1, 2015 (not translated).
(Continued)

*Primary Examiner* — Jaehwan Oh
(74) *Attorney, Agent, or Firm* — Ladas & Parry, LLP (57) ABSTRACT

The semiconductor device 1 includes an insulating substrate 2, a conductive part 3 that extends in a first direction, a conductive part 4 that is separated in a second direction and extends in the first direction, conductive parts 5 that are lined along the first direction between the part 3 and the part 4, high-side switches 11, 12 and 13, low-side switches 14, 15 and, signal terminals that are arrayed along the first direction, a power supply terminal 21 that is electrically connected to the part 3, a ground terminal 22 that is electrically connected to the part 4, and output terminals 23, 24 and 25 that are electrically connected respectively to the corresponding parts 5, arrayed along the first direction on the other end side of the substrate 2, and provided over a straight line L that passes through the part 4 and extends in the first direction.

8 Claims, 3 Drawing Sheets

(51) Int. Cl.
*H01L 23/528* (2006.01)
*H01L 23/522* (2006.01)
*H01L 23/50* (2006.01)
*H01L 23/495* (2006.01)
*H02M 7/00* (2006.01)
*H01L 23/31* (2006.01)
*H01L 23/00* (2006.01)

(52) U.S. Cl.
CPC .. *H01L 23/49541* (2013.01); *H01L 23/49575* (2013.01); *H01L 23/49838* (2013.01); *H01L 23/50* (2013.01); *H01L 23/528* (2013.01); *H01L 23/5228* (2013.01); *H01L 23/5286* (2013.01); *H01L 24/49* (2013.01); *H02M 7/003* (2013.01); *H01L 23/3121* (2013.01); *H01L 24/45* (2013.01); *H01L 2224/45124* (2013.01); *H01L 2224/45144* (2013.01); *H01L 2224/48227* (2013.01); *H01L 2224/48247* (2013.01); *H01L 2224/4903* (2013.01); *H01L 2224/49111* (2013.01); *H01L 2224/49431* (2013.01); *H01L 2924/19105* (2013.01); *H01L 2924/19107* (2013.01)

(58) Field of Classification Search
CPC ..... H01L 33/62; H01L 33/486; H01L 33/642; H01L 33/20; H01L 27/153
See application file for complete search history.

(56) References Cited

U.S. PATENT DOCUMENTS

2010/0155915 A1* 6/2010 Bell ................ H01L 21/823487
257/676
2013/0147540 A1* 6/2013 Wu ..................... H01L 27/0883
327/382
2015/0115423 A1* 4/2015 Yamashita ........ H01L 23/49575
257/675

FOREIGN PATENT DOCUMENTS

JP 2011/250491 12/2011
JP 2014/72316 4/2014
WO 98/10508 A1 3/1998

OTHER PUBLICATIONS

Written Opinion for related PCT/JP2015/065519 mailed on Sep. 1, 2015 and its English translation of Box 5 by Google Translate/OCR by Abode Acrobat Pro.

* cited by examiner

F I G. 3

SEMICONDUCTOR DEVICE AND MANUFACTURING METHOD OF THE SAME

CROSS-REFERENCE TO RELATED APPLICATIONS

This application is the U.S. National Stage of International Patent Application No. PCT/JP2015/065519 filed on May 29, 2015, the disclosure of which is hereby incorporated by reference in its entirety.

TECHNICAL FIELD

The present invention relates to a semiconductor device and its manufacturing method.

BACKGROUND ART

Conventionally, as one of semiconductor devices, an inverter device that converts DC power inputted from a DC power source to AC power and outputs it is known. The inverter device is used, for instance, to convert a DC voltage to a 3-phase AC voltage and drive a 3-phase motor. For such a semiconductor device, miniaturization and efficiency improvement have been demanded more and more in recent years.

Patent Literature 1 describes an inverter device for a purpose of reducing inductance and miniaturizing a device. In this inverter device, both of power supply terminals (inverter input terminals) and ground terminals (inverter ground terminals) are arrayed in one direction without being bundled into one (see FIG. 20 in Patent Literature 1).

Patent Literature 2 describes an inverter device for a purpose of reducing loss and noise. In this inverter device, a power supply block electrically connected to a power supply terminal and a ground block connected to the ground are adjacently arranged (see FIG. 15 in Patent Literature 2).

CITATION LIST

Patent Literature

Patent Literature 1: Japanese Patent Laid-Open No. 2011-250491
Patent Literature 2: Japanese Patent Laid-Open No. 2014-72316

SUMMARY OF INVENTION

Technical Problem

However, in the inverter device of Patent Literature 1, since the power supply terminals and the ground terminals are not bundled into one, a horizontal width increases and it is difficult to advance miniaturization. Also, in the inverter device of Patent Literature 2, since the power supply block and the ground block are adjacently arranged, a current route becomes long, wiring resistance increases, and there is a problem of efficiency decline.

Therefore, an object of the present invention is to provide a semiconductor device of small wiring resistance and high efficiency, which can be miniaturized.

Solution to Problem

A semiconductor device relating to the present invention is a semiconductor device that converts DC power to AC power, and includes:
an insulating substrate;
a first conductive part provided on the insulating substrate so as to extend in a first direction;
a second conductive part provided on the insulating substrate so as to be separated from the first conductive part in a second direction different from the first direction and to extend in the first direction;
a plurality of third conductive parts provided on the insulating substrate so as to be lined along the first direction between the first conductive part and the second conductive part;
a plurality of first switches mounted on the first conductive part along the first direction, and each provided with a first main electrode, a second main electrode and a control electrode, the first main electrode being electrically connected to the first conductive part;
a plurality of second switches each mounted on the corresponding third conductive part, and each provided with a third main electrode, a fourth main electrode and a control electrode, the third main electrode being electrically connected to the second main electrode of the first switch, the fourth main electrode being electrically connected to the second conductive part;
a plurality of signal terminals arrayed along the first direction so that the first conductive part is positioned between the signal terminals and the third conductive parts;
a power supply terminal electrically connected to the first conductive part, and arranged on one end side of the insulating substrate where the plurality of signal terminals are provided;
a ground terminal electrically connected to the second conductive part, and arranged on the one end side of the insulating substrate; and
a plurality of output terminals each electrically connected to the corresponding third conductive part, arrayed along the first direction on the other end side which is an opposite side of the one end side of the insulating substrate, and provided over a straight line that passes through the second conductive part and extends in the first direction.

Also, in the semiconductor device,
the fourth main electrode of the second switch and the second conductive part may be electrically connected by a conductive wire, and the conductive wire may have one end connected to the fourth main electrode, and have the other end connected to an area between the output terminals that are adjacent to each other in the second conductive part.

Also, in the semiconductor device,
tips of the plurality of signal terminals may be arranged zigzag along the first direction.

Also, in the semiconductor device,
tips of the power supply terminal and the ground terminal may be arranged zigzag to the plurality of signal terminals.

Also, in the semiconductor device,
at least one of the power supply terminal, the ground terminal and the output terminals may have a planar shape that avoids a conductive part provided on a corner of the insulating substrate.

Also, in the semiconductor device,
the planar shape may be an L shape.

A manufacturing method of a semiconductor device relating to the present invention is a manufacturing method of a semiconductor device that converts DC power to AC power, and includes:
preparing a wiring board having an insulating substrate, a first conductive part provided on the insulating substrate so as to extend in a first direction, a second conductive part provided on the insulating substrate so as to be separated from the first conductive part in a second direction different from the first direction and to extend in the first direction, and a plurality of third conductive parts provided on the insulating substrate so as to be lined along the first direction between the first conductive part and the second conductive part;

preparing a lead frame having a first terminal group including a plurality of signal terminals, a power supply terminal and a ground terminal, and a second terminal group including a plurality of output terminals;

mounting a plurality of first switches on the first conductive part along the first direction with cream solder interposed therebetween, and mounting second switches on the individual third conductive parts with cream solder interposed therebetween;

positioning the wiring board and the lead frame so that a base of the power supply terminal, a base of the ground terminal, and bases of the output terminals are respectively in contact on the first conductive part, on a fourth conductive part which is connected to the second conductive part and extending in the second direction, and on the third conductive parts with cream solder interposed therebetween;

joining the power supply terminal, the ground terminal and the output terminals to the first conductive part, the second conductive part and the third conductive parts respectively, by reflow processing; and bonding the second conductive part and the main electrode of the second switch by a conductive wire.

Also, in the manufacturing method of the semiconductor device, the bonding may include first connection of connecting one end of the conductive wire to the main electrode of the second switch, and second connection of connecting the other end of the conductive wire to an area between the output terminals that are adjacent to each other in the second conductive part, after the first connection.

Advantageous Effects of Invention

The semiconductor device relating to the present invention includes a first conductive part that extends in a first direction, a second conductive part that is separated in a second direction different from the first direction and extends in the first direction, a plurality of third conductive parts that are lined along the first direction between the first conductive part and the second conductive part, a plurality of first switches that are mounted on the first conductive part along the first direction, a plurality of second switches that are mounted respectively on the corresponding third conductive parts, a plurality of signal terminals that are arrayed along the first direction so that the first conductive part is positioned between the signal terminals and the third conductive parts, a power supply terminal that is electrically connected to the first conductive part, a ground terminal that is electrically connected to the second conductive part, and a plurality of output terminals that are electrically connected respectively to the corresponding third conductive parts. Then, the power supply terminal and the ground terminal are arranged on one end side of an insulating substrate where the plurality of signal terminals are provided, and the plurality of output terminals are arrayed along the first direction on the other end side of the insulating substrate. Also, the individual output terminals are provided over a straight line that passes through the second conductive part and extends in the first direction. By such a configuration, according to the present invention, the semiconductor device can be miniaturized, and the semiconductor device of small wiring resistance and high efficiency can be provided.

DESCRIPTION OF EMBODIMENT

Hereinafter, a semiconductor device relating to an embodiment of the present invention and its manufacturing method will be described while referring to the drawings.

[Semiconductor Device]

A semiconductor device 1 relating to the embodiment of the present invention will be described with reference to FIG. 1 and FIG. 2. The semiconductor device 1 relating to the embodiment is, as illustrated in a circuit diagram in FIG. 2, a semiconductor device (inverter device) that converts DC power inputted from a DC power source (not shown in the figure) connected to a power supply terminal 21 and a ground terminal 22 to 3-phase AC power and outputs it from output terminals 23, 24 and 25.

In the semiconductor device 1, on an insulating substrate 2 provided with conductive parts 3 to 7 on an upper surface, high-side switches 11, 12 and 13 and low-side switches 14, 15 and 16 are mounted, constituting a 3-phase full bridge circuit.

Figure 1:
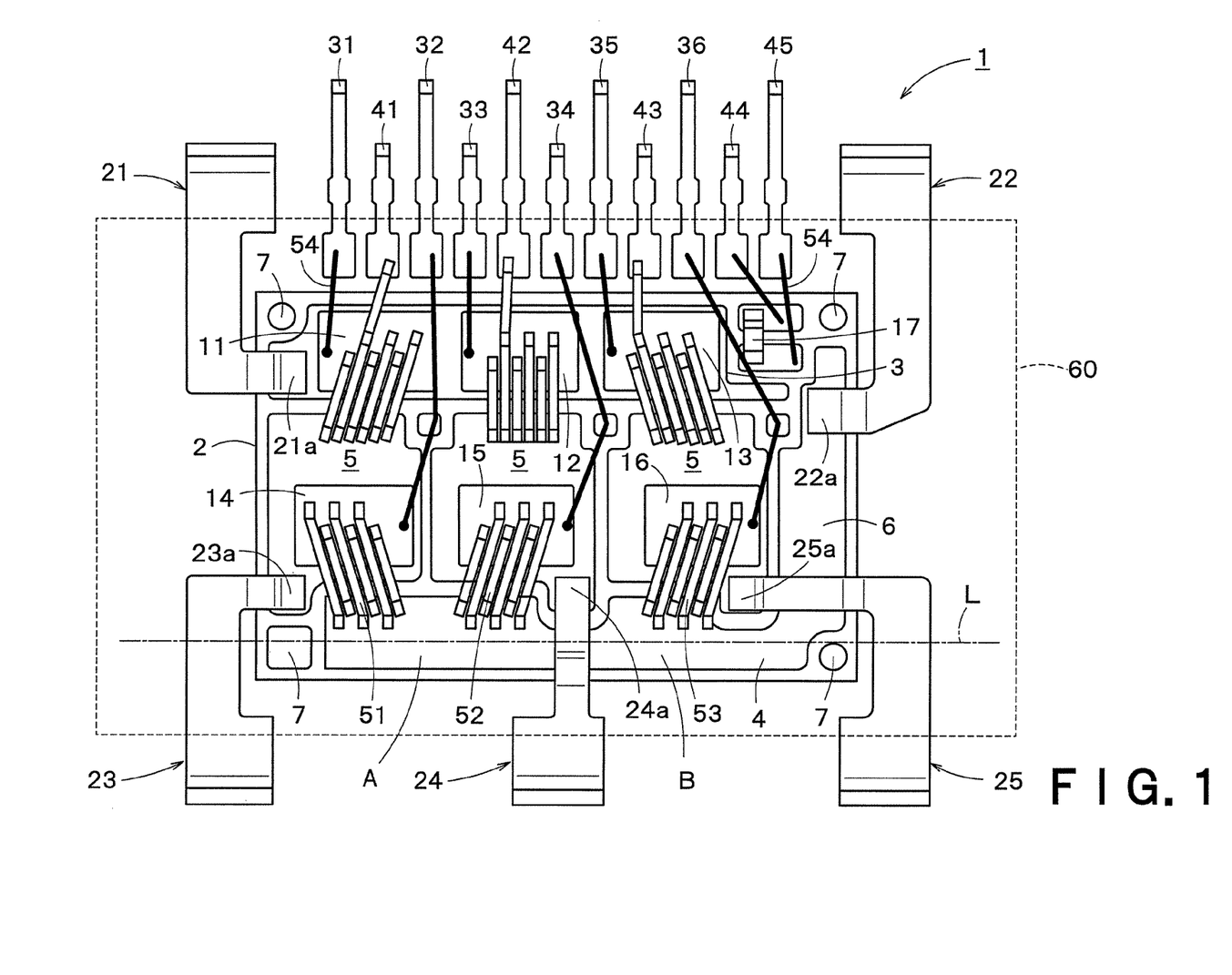
FIG. 1 is a plan view illustrating a schematic configuration of a semiconductor device 1 relating to an embodiment.
Figure 2:
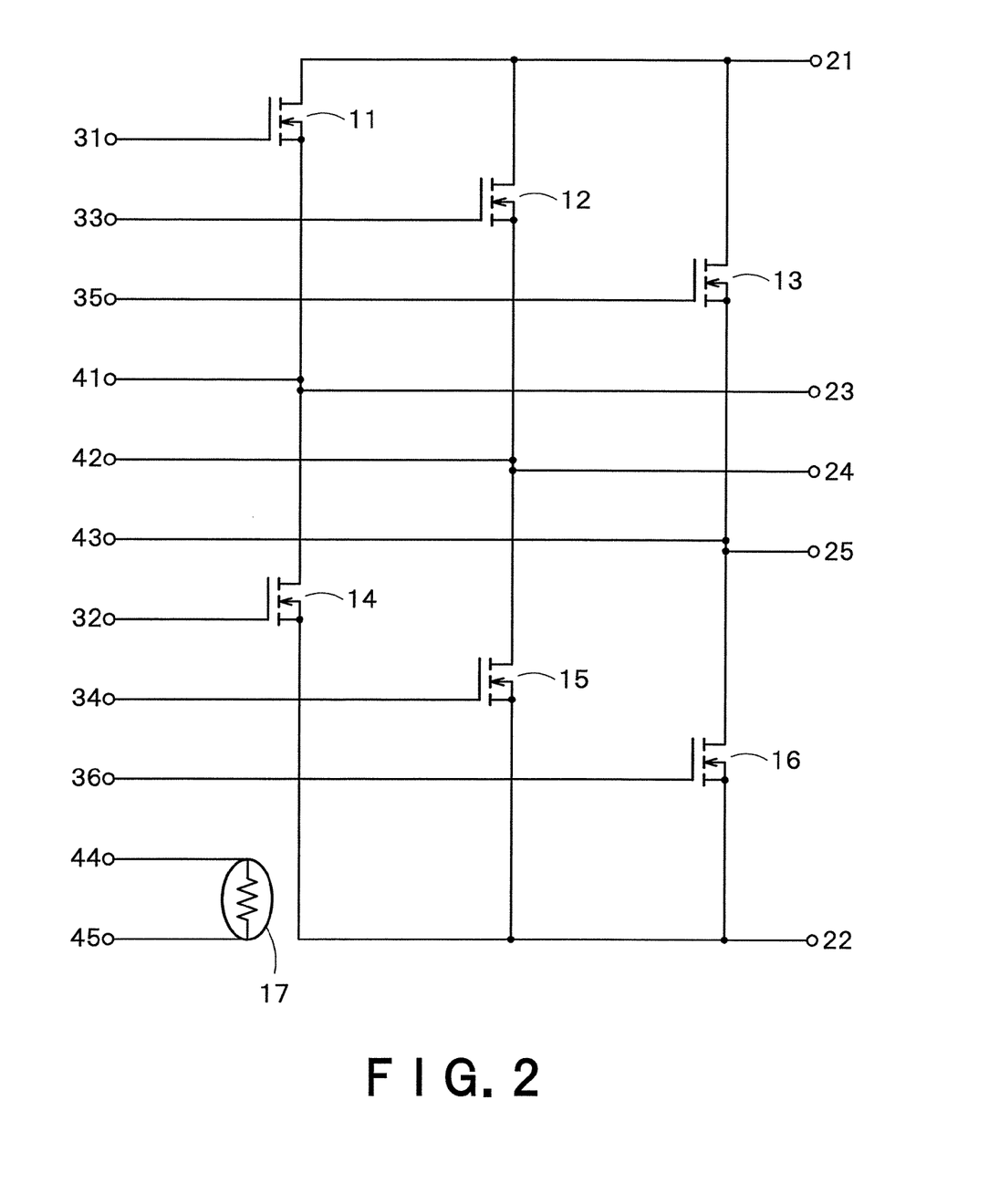
FIG. 2 is a circuit diagram illustrating a circuit configuration of the semiconductor device 1 relating to the embodiment.

The semiconductor device 1 includes, as illustrated in FIG. 1, the insulating substrate 2 such as a ceramic substrate, a conductive part 3 (first conductive part), a conductive part 4 (second conductive part), a plurality of conductive parts 5 (third conductive parts), a conductive part 6 (fourth conductive part), a conductive part 7, high-side switches 11, 12 and 13 (a plurality of first switches), the low-side switches 14, 15 and 16 (a plurality of second switches), control terminals 31 to 36, monitor terminals 41 to 45, the power supply terminal 21, the ground terminal 22, the output terminals 23, 24 and 25, a thermistor 17, conductive wires 51 to 53 such as Al wires, and a sealing part 60. Hereinafter, individual components of the semiconductor device 1 will be described in detail.

The conductive parts 3 to 7 are conductive patterns provided on the upper surface of the insulating substrate 2. The conductive parts 3 to 7 are composed of a metal such as copper or aluminum. Note that, a lower surface of the insulating substrate 2 may be covered with a metal layer (not shown in the figure) in order to improve a heat radiation property.

The conductive part 3 is, as illustrated in FIG. 1, provided on the insulating substrate 2 so as to extend in a first direction. On the conductive part 3, the high-side switches 11, 12 and 13 are mounted.

The conductive part 4 is, as illustrated in FIG. 1, provided on the insulating substrate 2 so as to be separated from the conductive part 3 in a second direction and to extend in the first direction. That is, the conductive part 4 is provided roughly in parallel with the conductive part 3. Here, the second direction is a direction different from the first direction, and is, for example, a direction orthogonal to the first direction.

The conductive part 4 is electrically connected to the ground terminal 22 through the conductive part 6. The conductive part 6 is connected to the conductive part 4 and extends in the second direction. Note that, the conductive part 6 is not an essential configuration, and the conductive part 4 may be directly connected to the ground terminal 22. For example, a terminal formed longer for a portion corresponding to a length of the conductive part 6 is used as the ground terminal 22, and a terminal in a shape (l shape or the like) that does not interfere with the ground terminal 22 is used as the output terminal 25.

The plurality of conductive parts 5 are, as illustrated in FIG. 1, provided on the insulating substrate 2 so as to be lined along the first direction between the conductive part 3 and the conductive part 4. On the individual conductive parts 5, the low-side switches 14, 15 and 16 are mounted one by one.

The conductive part 7 is, as illustrated in FIG. 1, provided in an island shape on a corner of the insulating substrate 2. The conductive part 7 is part where a mold die is to be in contact when forming the sealing part 60 in manufacture of the semiconductor device 1.

The high-side switches 11, 12 and 13 have a drain electrode (first main electrode), a source electrode (second main electrode) and a gate electrode (control electrode). The drain electrodes, the source electrodes and the gate electrodes are provided respectively on a lower surface, an upper surface and a side face of the high-side switches 11, 12 and 13. Note that, the high-side switches 11, 12 and 13 and the low-side switches 14, 15 and 16 are power MOSFETs for example, but may be other semiconductor switching elements such as an IGBT.

The high-side switches 11, 12 and 13 are mounted on the conductive part 3 along the first direction. The drain electrodes of the high-side switches 11, 12 and 13 are electrically connected to the conductive part 3 through solder (not shown in the figure). Also, the source electrodes of the high-side switches 11, 12 and 13 are electrically connected respectively to the drain electrodes of the corresponding low-side switches 14, 15 and 16 through conductive wires such as Al wires and the conductive parts 5. The gate electrodes of the high-side switches 11, 12 and 13 are electrically connected respectively to the control terminals 31, 33 and 35 through thin metallic wires 54 such as gold wires.

The low-side switches 14, 15 and 16 have a drain electrode (third main electrode), a source electrode (fourth main electrode) and a gate electrode (control electrode). The drain electrodes, the source electrodes and the gate electrodes are provided respectively on a lower surface, an upper surface and side face of the low-side switches 14, 15 and 16.

The low-side switches 14, 15 and 16 are mounted respectively on the corresponding conductive parts 5. The drain electrodes of the low-side switches 14, 15 and 16 are electrically connected to the source electrodes of the corresponding high-side switches 11, 12 and 13 through the conductive parts 5 and the conductive wires. The source electrodes of the low-side switches 14, 15 and 16 are electrically connected to the conductive part 4 through the conductive wires 51, 52 and 53. The gate electrodes of the low-side switches 14, 15 and 16 are electrically connected respectively to the control terminals 32, 34 and 36 through thin metallic wires.

The semiconductor device 1 has, as signal terminals, the control terminals 31 to 36 and the monitor terminals 41 to 45. The control terminals 31, 33 and 35 are terminals for controlling ON/OFF of the high-side switches 11, 12 and 13, and the control terminals 32, 34 and 36 are terminals for controlling ON/OFF of the low-side switches 14, 15 and 16.

The monitor terminals 41, 42 and 43 are terminals for monitoring output voltages of the individual phases. The monitor terminal 41 is electrically connected to the source electrode of the high-side switch 11 and the drain electrode of the low-side switch 14. Similarly, the monitor terminal 42 is electrically connected to the source electrode of the high-side switch 12 and the drain electrode of the low-side switch 15, and the monitor terminal 43 is electrically connected to the source electrode of the high-side switch 13 and the drain electrode of the low-side switch 16.

The monitor terminals 44 and 45 are terminals for monitoring a voltage of the thermistor 17. The thermistor 17 is provided in order to measure an internal temperature of the semiconductor device 1. As the thermistor 17, for example, the one of an NTC type in which resistance becomes smaller as the temperature becomes higher is used.

As illustrated in FIG. 1, the control terminals 31 to 36 and the monitor terminals 41 to 45 are lined along one end of the insulating substrate 2 and arranged. In other words, the control terminals 31 to 36 and the monitor terminals 41 to 45 are arrayed along the first direction so that the conductive part 3 is positioned between the control terminals 31 to 36 and the monitor terminals 41 to 45 and the plurality of conductive parts 5.

Note that, tips of the plurality of signal terminals may be arranged zigzag along the first direction. In the present embodiment, as illustrated in FIG. 1, the tips of the control terminals 31 to 36 and the monitor terminals 41 to 45 are alternately shifted in the second direction. Thus, a pitch of through-holes of a control board (not shown in the figure) on which the semiconductor device 1 is mounted can be mitigated.

The power supply terminal 21 is a terminal for being connected to the DC power source, and the ground terminal 22 is a terminal for grounding. As illustrated in FIG. 1, tips of the power supply terminal 21 and the ground terminal 22 are arranged on one end side of the insulating substrate 2 where the plurality of signal terminals are provided.

The power supply terminal 21 is electrically connected to the conductive part 3. More specifically, the power supply terminal 21 is soldered to the conductive part 3 at the base 21a. The ground terminal 22 is electrically connected to the conductive part 4. More specifically, the ground terminal 22 is soldered to the conductive part 6 at the base 22a. The power supply terminal 21 and the ground terminal 22 are, as illustrated in FIG. 1, provided so as to hold the control terminals 31 to 36 and the monitor terminals 41 to 45 therebetween.

Note that, as illustrated in FIG. 1, tips of the power supply terminal 21 and the ground terminal 22 may be arranged zigzag to the control terminals 31 to 36 and the monitor terminals 41 to 45 (the plurality of signal terminals).

The output terminals 23, 24 and 25 (the plurality of output terminals) are terminals for outputting 3-phase alternating currents converted by the 3-phase full bridge circuit, and are electrically connected respectively to the corresponding conductive parts 5. More specifically, the output terminals 23, 24 and 25 are soldered to the corresponding conductive parts 5 at the bases 23a, 24a and 25a.

As illustrated in FIG. 1, the output terminals 23, 24 and 25 are arranged on an opposite side of the control terminals 31 to 36 and the monitor terminals 41 to 45. That is, the output terminals 23, 24 and 25 are arrayed along the first direction on the other end side which is the opposite side of one end side of the insulating substrate 2. Tips of the output terminals 23, 24 and 25 are arranged on the other end side of the insulating substrate 2. Also, the output terminals 23, 24 and 25 are provided over a straight line L as illustrated in FIG. 1. The straight line L is a straight line that passes through the conductive part 4 and extends in the first direction.

Also, at least one of the power supply terminal 21, the ground terminal 22 and the output terminals 23, 24 and 25 may have a planar shape that avoids the conductive parts 7 provided on four corners of the insulating substrate 2. Thus, when the sealing part 60 is formed, the terminal can be prevented from interfering with a mold die. In the present embodiment, the planar shape of the power supply terminal 21, the ground terminal 22 and the output terminals 23 and 25 is an L shape so as to avoid the conductive parts 7, as illustrated in FIG. 1. However, the planar shape is not limited to the L shape and may be another shape (an arc shape for example) as long as it is a shape that avoids the conductive part 7.

As described above, the source electrode of the low-side switch 14 and the conductive part 4 are electrically connected by the conductive wire 51. The conductive wire 51 is, as illustrated in FIG. 1, connected to the source electrode of the low-side switch 14 at one end, and connected to an area "A" between the output terminal 23 and the output terminal 24 that are adjacent to each other in the conductive part 4 at the other end. Similarly, the conductive wire 52 that electrically connects the source electrode of the low-side switch 15 and the conductive part 4 is connected to the source electrode of the low-side switch 15 at one end, and connected to the area "A" at the other end. The conductive wire 53 that electrically connects the source electrode of the low-side switch 16 and the conductive part 4 is, as illustrated in FIG. 1, connected to the source electrode of the low-side switch 16 at one end, and connected to an area "B" between the output terminal 24 and the output terminal 25 that are adjacent to each other in the conductive part 4 at the other end.

The sealing part 60 seals an upper surface side of the insulating substrate 2, the conductive parts 3 to 7, the high-side switches 11, 12 and 13, the low-side switches 14, 15 and 16, the thermistor 17, the conductive wires 51, 52 and 53, and some of the various kinds of terminals.

As described above, the semiconductor device 1 relating to the present embodiment includes the conductive part 3 that extends in the first direction, the conductive part 4 that is separated in the second direction different from the first direction and extends in the first direction, the plurality of conductive parts 5 that are lined along the first direction between the conductive part 3 and the conductive part 4, the high-side switches 11, 12 and 13 that are mounted on the conductive part 3 along the first direction, the low-side switches 14, 15 and 16 that are mounted respectively on the corresponding conductive parts 5, the plurality of signal terminals that are arrayed along the first direction so that the conductive part 3 is positioned between the signal terminals and the conductive parts 5, the power supply terminal 21 that is electrically connected to the conductive part 3, the ground terminal 22 that is electrically connected to the conductive part 4, and the plurality of output terminals 23, 24 and 25 that are electrically connected respectively to the corresponding conductive parts 5. Then, the power supply terminal 21 and the ground terminal 22 are arranged on one end side of the insulating substrate 2 where the plurality of signal terminals are provided, and the plurality of output terminals 23, 24 and 25 are arrayed along the first direction on the other end side of the insulating substrate 2. Also, the output terminals 23, 24 and 25 are provided over the straight line L that passes through the conductive part 4 and extends in the first direction. By such a configuration, a wiring length can be suppressed, impedance and inductance can be reduced, and a device size can be reduced.

Therefore, according to the present embodiment, the semiconductor device can be miniaturized, and the semiconductor device of the small wiring resistance and the high efficiency can be provided.

(Manufacturing Method of Semiconductor Device)

Next, the manufacturing method of the above-described semiconductor device 1 will be described.

Figure 3:
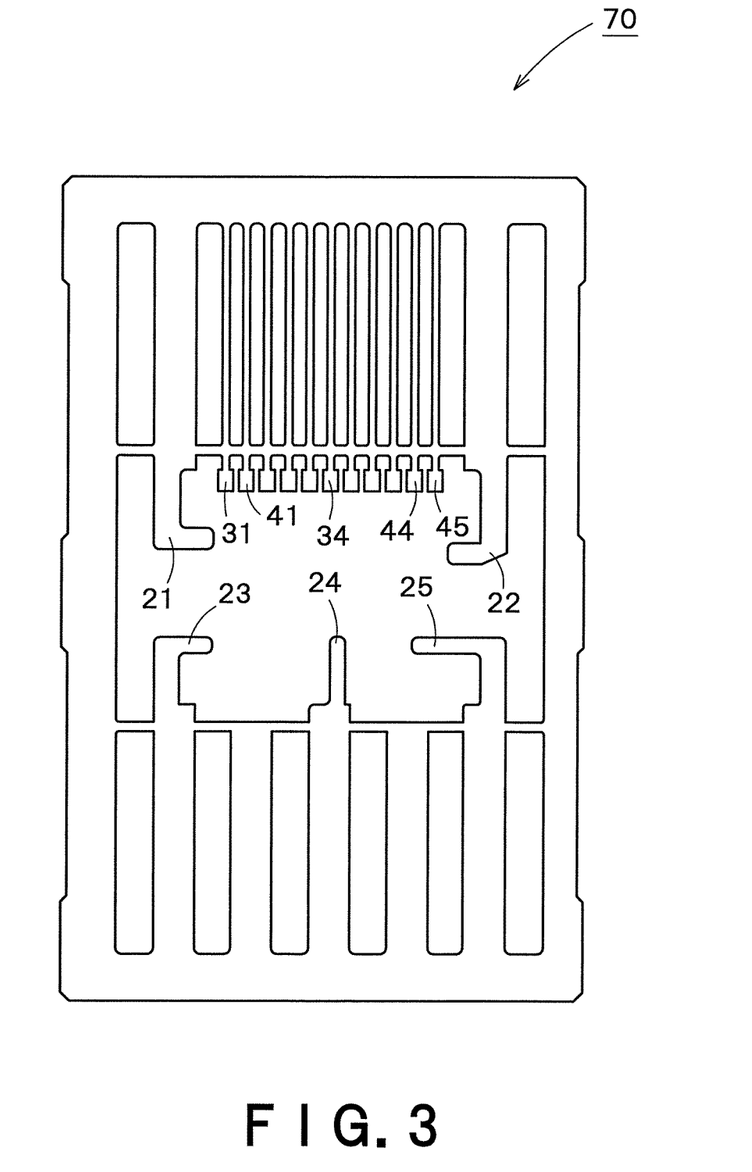
FIG. 3 is a plan view of a lead frame 70 used in manufacture of the semiconductor device 1 relating to the embodiment.

First, a wiring board (not shown in the figure) having the insulating substrate 2 and the conductive parts 3, 4 and 5 provided on the insulating substrate 2, and a lead frame 70 are prepared. The lead frame 70 has, as illustrated in FIG. 3, a first terminal group including the plurality of signal terminals (the control terminals 31 to 36 and the monitor terminals 41 to 45), the power supply terminal 21 and the ground terminal 22, and a second terminal group including the plurality of output terminals 23, 24 and 25. The bases of the terminals included in the first terminal group and the bases of the terminals included in the second terminal group are provided so as to face each other.

Next, the high-side switches 11, 12 and 13 are mounted along the first direction on the conductive part 3 with cream solder interposed therebetween, and the low-side switches 14, 15 and 16 are mounted on the individual conductive parts 5 with cream solder interposed therebetween. In addition, the thermistor 17 is also mounted on a predetermined location of the wiring board.

Next, the wiring board and the lead frame 70 are positioned so that the base 21a of the power supply terminal 21, the base 22a of the ground terminal 22, and the bases 23a, 24a and 25a of the output terminals 23, 24 and 25 are respectively in contact on the conductive part 3, on the conductive part 6, and on the conductive parts 5 with cream solder interposed therebetween.

Note that, without being limited to the above-described procedure, the high-side switches 11, 12 and 13 and the low-side switches 14, 15 and 16 may be mounted on the wiring board after the wiring board and the lead frame 70 are positioned.

Next, by reflow processing, the power supply terminal 21, the ground terminal 22 and the output terminals 23, 24 and 25 are joined respectively to the conductive part 3, the conductive part 4 and the conductive parts 5. Thereafter, flux residue is washed and removed.

Next, the conductive part 4 and the source electrodes of the low-side switches 14, 15 and 16 are connected by the conductive wires 51, 52 and 53 (bonding). The bonding includes first connection of connecting one end of the conductive wires 51, 52 and 53 to the source electrodes of the low-side switches 14, 15 and 16, and second connection of connecting the other end of the conductive wires 51, 52 and 53 to the areas "A" and "B" between the output terminals that are adjacent to each other in the conductive part 4, after the first connection.

Next, by a transfer molding method, the upper surface side of the insulating substrate 2, the high-side switches 11, 12 and 13, the low-side switches 14, 15 and 16, the conductive wires 51, 52 and 53, and some of the various kinds of terminals are sealed, and the sealing part 60 illustrated in FIG. 1 is formed. Thereafter, by cutting off unneeded parts (tie bars or the like) of the lead frame 70 and forming the various kinds of terminals, the semiconductor device 1 is obtained. Note that, in forming, the various kinds of terminals may be formed so that the tips of the plurality of signal terminals are arranged zigzag along the first direction.

In the above-described manufacturing method, in the bonding, by connecting the other end of the conductive wires 51, 52 and 53 to the areas "A" and "B" between the output terminals, a bonding device and the output terminals 23, 24 and 25 do not interfere, and the bonding device can easily cut the conductive wires on the conductive part 4. As a result, according to the present embodiment, manufacturability of the semiconductor device can be improved.

On the basis of the above description, those skilled in the art may conceive additional effects and various modifications of the present invention. However, aspects of the present invention are not limited to the individual embodiments described above. Components over the different embodiments may be appropriately combined. Various additions, modifications and partial deletion are possible without departing from the conceptual spirit and meaning of the present invention derived from contents defined in the scope of claims and the equivalency thereof.

REFERENCE SIGNS LIST

1 Semiconductor device
2 Insulating substrate
3, 4, 5, 6, 7 Conductive part
11, 12, 13 High-side switch
14, 15, 16 Low-side switch
17 Thermistor
21 Power supply terminal
22 Ground terminal
23, 24, 25 Output terminal
21a, 22a, 23a, 24a, 25a Base
31 to 36 Control terminal
41 to 45 Monitor terminal
51 to 53 Conductive wire
54 Thin metallic wire
60 Sealing part
70 Lead frame
A, B Area
L Straight line

The invention claimed is:

1. A semiconductor device that converts DC power to AC power, the semiconductor device comprising:
an insulating substrate;
a first conductive part provided on the insulating substrate so as to extend in a first direction;
a second conductive part provided on the insulating substrate so as to be separated from the first conductive part in a second direction different from the first direction and to extend in the first direction;
a plurality of third conductive parts provided on the insulating substrate so as to be lined along the first direction between the first conductive part and the second conductive part;
a plurality of first switches mounted on the first conductive part along the first direction, and each provided with a first main electrode, a second main electrode and a control electrode, the first main electrode being electrically connected to the first conductive part;
a plurality of second switches each mounted on the corresponding third conductive part, and each provided with a third main electrode, a fourth main electrode and a control electrode, the third main electrode being electrically connected to the second main electrode of the first switch, the fourth main electrode being electrically connected to the second conductive part;
a plurality of signal terminals arrayed along the first direction so that the first conductive part is positioned between the signal terminals and the third conductive parts;
a power supply terminal electrically connected to the first conductive part, and arranged on one end side of the insulating substrate where the plurality of signal terminals are provided;
a ground terminal electrically connected to the second conductive part, and arranged on the one end side of the insulating substrate; and
a plurality of output terminals each electrically connected to the corresponding third conductive part, arrayed along the first direction on the other end side which is an opposite side of the one end side of the insulating substrate, and provided over a straight line that passes through the second conductive part and extends in the first direction.

2. The semiconductor device according to claim 1, wherein the fourth main electrode of the second switch and the second conductive part are electrically connected by a conductive wire, and the conductive wire has one end connected to the fourth main electrode and has the other end connected to an area between the output terminals that are adjacent to each other in the second conductive part.

3. The semiconductor device according to claim 1, wherein tips of the plurality of signal terminals are arranged zigzag along the first direction.

4. The semiconductor device according to claim 3, wherein tips of the power supply terminal and the ground terminal are arranged zigzag to the plurality of signal terminals.

5. The semiconductor device according to claim 1, wherein at least one of the power supply terminal, the ground terminal and the output terminals has a planar shape that avoids a conductive part provided on a corner of the insulating substrate.

6. The semiconductor device according to claim 5, wherein the planar shape is an L shape.

7. A manufacturing method of a semiconductor device that converts DC power to AC power, the manufacturing method comprising:
preparing a wiring board having an insulating substrate, a first conductive part provided on the insulating substrate so as to extend in a first direction, a second conductive part provided on the insulating substrate so as to be separated from the first conductive part in a second direction different from the first direction and to extend in the first direction, and a plurality of third conductive parts provided on the insulating substrate so as to be lined along the first direction between the first conductive part and the second conductive part;
preparing a lead frame having a first terminal group including a plurality of signal terminals, a power supply terminal and a ground terminal, and a second terminal group including a plurality of output terminals;
mounting a plurality of first switches on the first conductive part along the first direction with cream solder interposed therebetween, and mounting second switches on the individual third conductive parts with cream solder interposed therebetween;
positioning the wiring board and the lead frame so that a base of the power supply terminal, a base of the ground terminal, and bases of the output terminals are respectively in contact on the first conductive part, on a fourth conductive part which is connected to the second conductive part and extending in the second direction, and on the third conductive parts, with cream solder interposed therebetween;

joining the power supply terminal, the ground terminal and the output terminals to the first conductive part, the second conductive part and the third conductive parts, respectively, by reflow processing; and bonding the second conductive part and the main electrode of the second switch by a conductive wire.

8. The manufacturing method of the semiconductor device according to claim 7, wherein the bonding includes first connection of connecting one end of the conductive wire to the main electrode of the second switch, and second connection of connecting the other end of the conductive wire to an area between the output terminals that are adjacent to each other in the second conductive part, after the first connection.

\* \* \* \* \*